United States Patent [19]

Kawana

[11] Patent Number: 5,338,982

[45] Date of Patent: Aug. 16, 1994

[54] PROGRAMMABLE LOGIC DEVICE

[75] Inventor: Keiichi Kawana, Tokyo, Japan

[73] Assignee: Kawasaki Steel Corporation, Kobe, Japan

[21] Appl. No.: 857,974

[22] Filed: Mar. 26, 1992

[30] Foreign Application Priority Data

Mar. 29, 1991 [JP] Japan .................. 3-066768

[51] Int. Cl.⁵ .......................... H03K 19/173
[52] U.S. Cl. .................... 307/465; 307/469; 307/473
[58] Field of Search ............ 307/465, 468, 469, 473

[56] References Cited

U.S. PATENT DOCUMENTS

| | | | |
|---|---|---|---|
| 4,223,277 | 9/1980 | Taylor et al. | 307/465 |
| 4,758,746 | 7/1988 | Birkner et al. | 307/465 |
| 4,833,349 | 5/1989 | Liu et al. | 307/468 |
| 4,847,612 | 7/1989 | Kaplinsky | 307/465 |
| 4,987,326 | 1/1991 | Satoh et al. | 307/465 |
| 5,028,821 | 7/1991 | Kaplinsky | 307/465 |
| 5,185,706 | 2/1993 | Agrawal | 307/465 |

Primary Examiner—Edward P. Westin
Assistant Examiner—Andrew Sanders
Attorney, Agent, or Firm—Oliff & Berridge

[57] ABSTRACT

A semiconductor integrated circuit capable of electrically writing functions according to this invention comprises a plurality of logical blocks capable of electrically writing functions and wire elements capable of programmably connecting the logical blocks to each other. Each of the logical blocks includes a gate element as an output buffer having a control terminal. The gate element assumes a high impedance state when inputting a control signal to the control terminal. An output of the logical block is thereby made unable; or the respective logical blocks are directly wired-connectable to effect logical sum outputting. Alternatively, the gate element assumes two output states of an open drain output and a totem-pole output. Hence, in the semiconductor integrated circuit of this invention, it is possible to improve a gate using efficiency of the small-sized programmable logical blocks and attain a high-density and high-integrated programmable logic device.

6 Claims, 11 Drawing Sheets

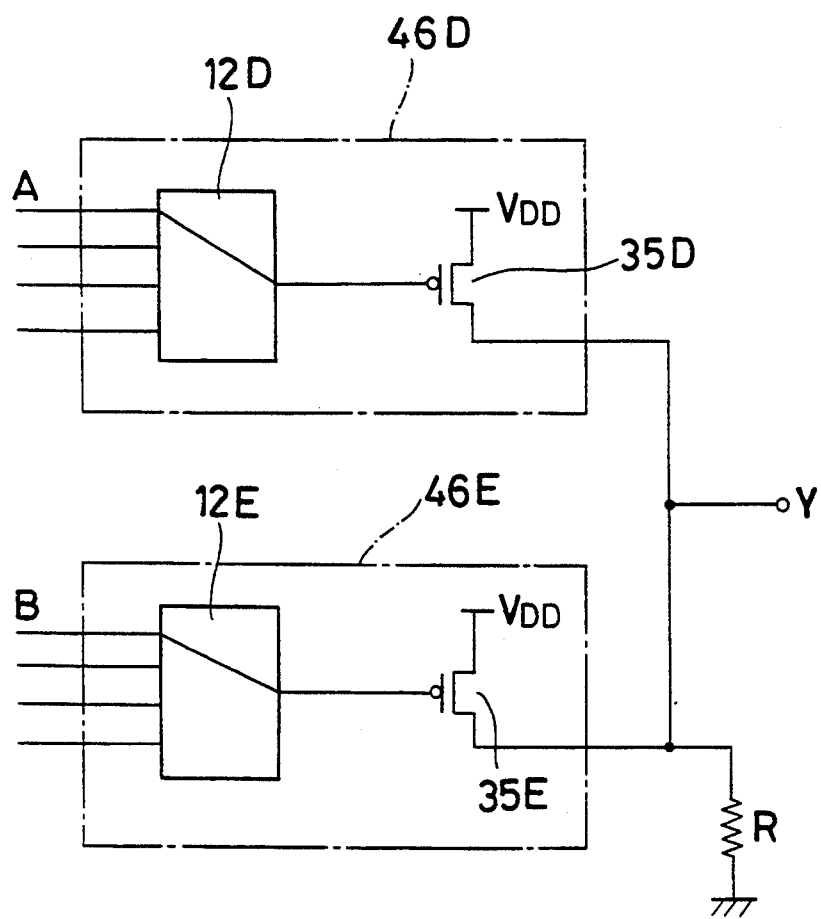
F I G. 14

FIG. 18
PRIOR ART
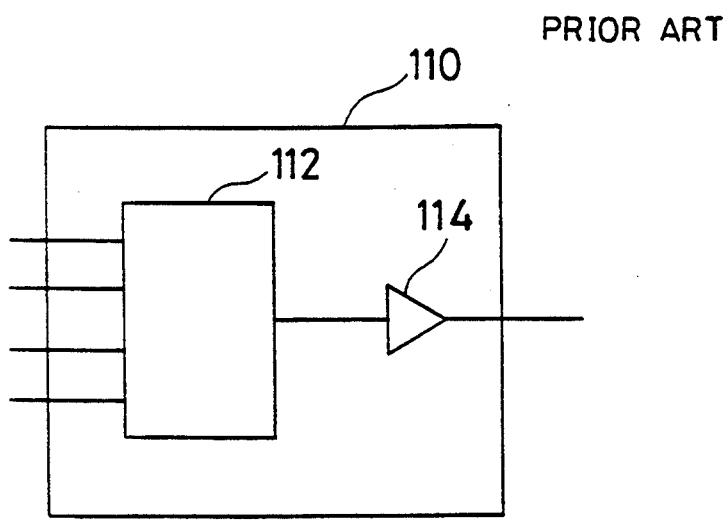
FIG. 19(a)        FIG. 19(b)    PRIOR ART
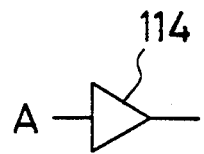
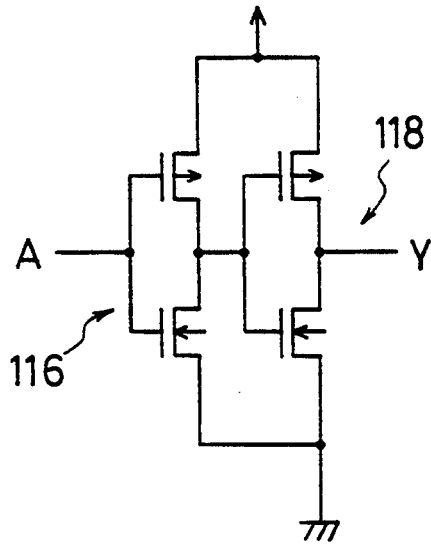

PROGRAMMABLE LOGIC DEVICE

BACKGROUND OF THE INVENTION

The present invention relates generally to a programmable logic device including a plurality of programmable logic elements and capable of arbitrarily connecting those programmable logic elements and, more particularly, to a semiconductor integrated circuit capable of enhancing a using efficiency of combinational logical units and flip-flops which are included in the programmable logic elements.

For example, a PLD (Programmable Logic Device) and a FPGA (Field Programmable Gate Array) have hitherto been known as programmable logic devices constructed so that an arbitrary logical circuit can be actualized by the user's writing logic as a kind of data in the form of program data.

For instance, the conventional FPGA is composed mainly of: small-sized logical blocks (Programmable Logic Elements; PLEs) capable of programing logical functions; and wire elements capable of programmably connecting the small-sized logical blocks. FIG. 17 is a block diagram showing one example of, e.g., a field programmable gate array.

As illustrated therein, the field programmable gate array includes a plurality of small-sized programmable logical blocks (hereinafter referred to as [logical blocks]) 10 and programmable wire means provided lengthwise and crosswise between these logical blocks 10. The wire means have switch stations 20 capable of programmably connecting the logical blocks 10, I/O lines 22 extending from the switch stations 20 to the respective logical blocks 10 and inter switch station wires 24. Inputs and outputs of the respective logical blocks 10 are arbitrarily connectable through the wire means, i.e., the I/O lines 22, the switch stations (SS) 20 and the inter SS wires 24.

As described above, the small-sized logical blocks capable of programming the logical functions include a small number of I/O terminals. The user performs an operation to allocate the want-to-write circuits to the small-sized logical blocks just when writing to the field programmable gate array.

If such allocations are executed, the circuit designed by the user is divided into a plurality of small-sized logical blocks for attaining the circuit function thereof. Reversely speaking, the plurality of small-sized logical blocks are connected through the programmably connectable wire elements, thereby achieving one circuit function.

For example, when the user circuit contains multi-input multiplexers, the number of small-sized logical blocks to be divided increases in a case where the multiplexers are constructed of (1) the small-sized logical gates (e.g., combinational logical circuits) allocated to the small-sized logical blocks and (2) the programmable wires. A large proportion of the programmable portions (small-sized logical gates and wires) in the programmable logic device are consumed, resulting in such a problem that the gate using efficiency decreases.

BRIEF SUMMARY OF THE INVENTION

It is a primary object of the present invention, which obviates the foregoing problems, to provide a semiconductor integrated circuit capable of improving a gate using efficiency of small-sized logical blocks possible of programming.

To accomplish the above-described object, according to a first aspect of the present invention, there is provided a semiconductor integrated circuit having electrically writable functions, comprising: a plurality of logical blocks having electrically writable functions; and wire elements capable of programmably connecting the logical blocks to each other, wherein each of the logical blocks includes a gate element having a control terminal connectable to output terminals of a plurality of other logical blocks, and the gate element is brought into a high impedance state when a signal assuming a predetermined level is inputted to the control terminal of the gate element with the result that an output of the logical block becomes unable.

Preferably, said gate element is a tri-state output gate element.

According to a second aspect of the invention, there is provided a semiconductor integrated circuit having electrically writable functions, comprising: a plurality of logical blocks having electrically writable functions; and wire elements capable of programmably connecting the logical blocks to each other, wherein the respective logical blocks are wired-connected in common to at least one of other logical blocks through wire elements and include output gates capable of programmably constructing a logical block group for attaining a predetermined logical function, and outputs of the output gates are given forth while taking a logical sum with an output of at least one other wired-connected logical block.

According to a third aspect of the invention, there is provided a semiconductor integrated circuit having electrically writable functions, comprising: a plurality of logical blocks having electrically writable functions; and wire elements capable of programmably connecting the logical blocks to each other, wherein each of the logical blocks includes a programmable gate element having a control terminal, and the programmable gate element assumes a first state of a totem-pole output and a second state of an open drain output.

Preferably, an output terminal of said logical block is programmably connectable to one of power source terminals via a sesistor element.

Preferably, in the above aspect, a logic of said control terminal of the programmable gate element can be inverted.

BRIEF DESCRIPTION OF THE DRAWINGS

Other objects and advantages of the present invention will become apparent during the following discussion taken in conjunction with the accompanying drawings, in which:

FIG. 14 is a circuit diagram showing one example of a wired OR circuit equivalent to the OR circuit depicted in FIG. 13;

FIG. 18 is a circuit diagram illustrating a construction of a conventional logical block;

FIGS. 19a and 19b show a circuit diagram illustrating a structure of a buffer of the logical block depicted in FIG. 18.

DETAILED DESCRIPTION OF THE INVENTION

Figure 1:
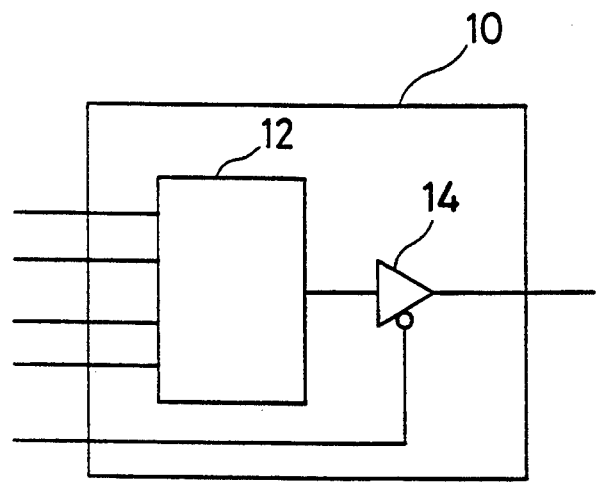
FIG. 1 is a block diagram showing one embodiment of a logical block used for a semiconductor integrated circuit in a first aspect of the present invention.

According to the present invention, small-sized logical blocks are directly connected to each other to form one logical block group. A desired logical circuit can be thus configured. It is therefore possible to construct the desired logic more easily than by the conventional logical blocks. The number of gates to be employed can be reduced, and a gate integration density can be also improved as a whole semiconductor integrated circuit.

For this reason, as in a first aspect of the present invention, there is provided a gate element with a control terminal which is connected to an output terminal of a combinational logical unit of a logical block. The control terminal of this gate element is capable of switching an output signal of the logical block to an enable state and a high impedance state. Besides, the control terminal of the gate element is connected to the output terminals of other logical blocks and then controlled. Hence, the output terminals of the logical block group are directly connected to each other through a wire group, thereby making it possible to attain a desired circuit function with a high density.

Further, in a aspect mode of the present invention, the output terminals of the logical block group are wired-connected through programmable wires for attaining one logical function. Taken virtually is the wired OR of logical signals outputted from the wired-connected output terminals. Hence, the group of logical blocks are directly connectable through the programmable wires. It is therefore feasible to reduce the number of gates and improve a gate using efficiency.

Moreover, in a third aspect of the present invention, a programmable gate element including a control terminal is connected to an output terminal of a combinational logical unit of the logical block. This gate element is used, e.g., as a tri-state output gate capable of switching the above-mentioned enable state and the high impedance state in the first aspect as a first mode (state) of the totem-pole output. On the other hand, the gate element can be used for constructing a wired OR function by making possible the wired connection in the above-mentioned second aspect as a second mode (state) of an open drain output. Therefore, as in the same way with the first and second aspects, the output terminals of each logical block group are directly connectable through the programmable wire elements. Further, the desired circuit function is attainable with a less number of logical blocks than in the prior arts. Namely, the number of gates required can be reduced, and the gate using efficiency can be improved.

In addition, when the output terminals of the logical blocks are programmably connectable to one of the power source terminals via a resistor element, it is possible to achieve a programmable device including the resistor element which is required to achieve a wired logic in the aforementioned second and third aspects of the present invention.

Based on the logical structure of the above-described logical blocks, according to the present invention, the logical blocks are directly connected to each other with respect to the outputs of not only the combinational logical circuits but also flip-flops (FFs) and selectors. The output terminal thereof can be thereby controlled.

A semiconductor integrated circuit according to the present invention will hereinafter be described in detail by way of preferred embodiments illustrated in the accompanying drawings.

FIG. 1 shows one example of a logical block used for a programmable logic device defined as a semiconductor integrated circuit of the present invention. A logical block 10 depicted in FIG. 1 is composed of a plurality of gates. In accordance with a first mode of the present invention, the logical block 10 includes a programmable combinational logical unit 12 and a tri-state output gate (hereinafter referred to as a [3-state gate]) 14.

The combinational logical unit 12 comprises a programmable logic device (PLD) formed of an OR plane and an AND plane having programmable product term lines and a circuit, provided with a memory for storing a logic specification per input combination, for obtaining a logical output based on a table look-up system. Shown in the Figure are four inputs of this combinational logical unit 12, however, this is not a limited number. There are other cases where the number of inputs is 2 or 8, etc. Further, an output terminal of the combinational logical unit 12 is connected to the 3-state gate 14 constituting an output buffer unit thereof.

Figure 2A:
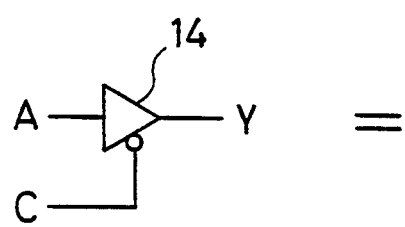
FIGS. 2(a) and 2(b) show a circuit diagram based on a MIL notation in one embodiment of a tri-state gate depicted in FIG. 1.
Figure 2B:
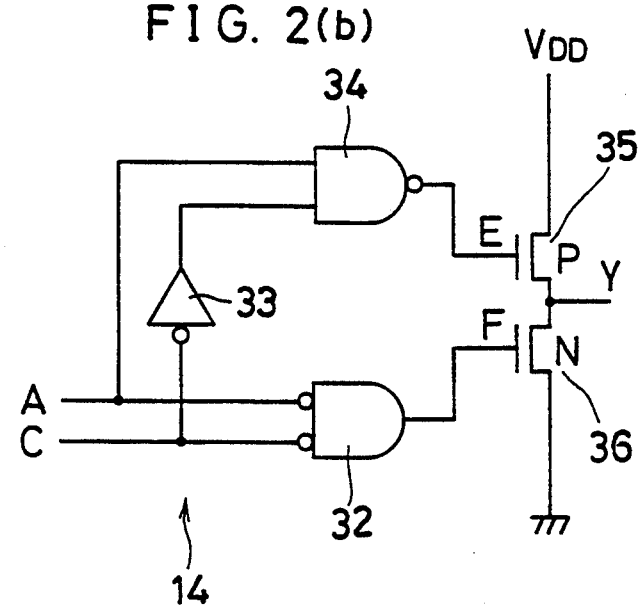
Figure 3:
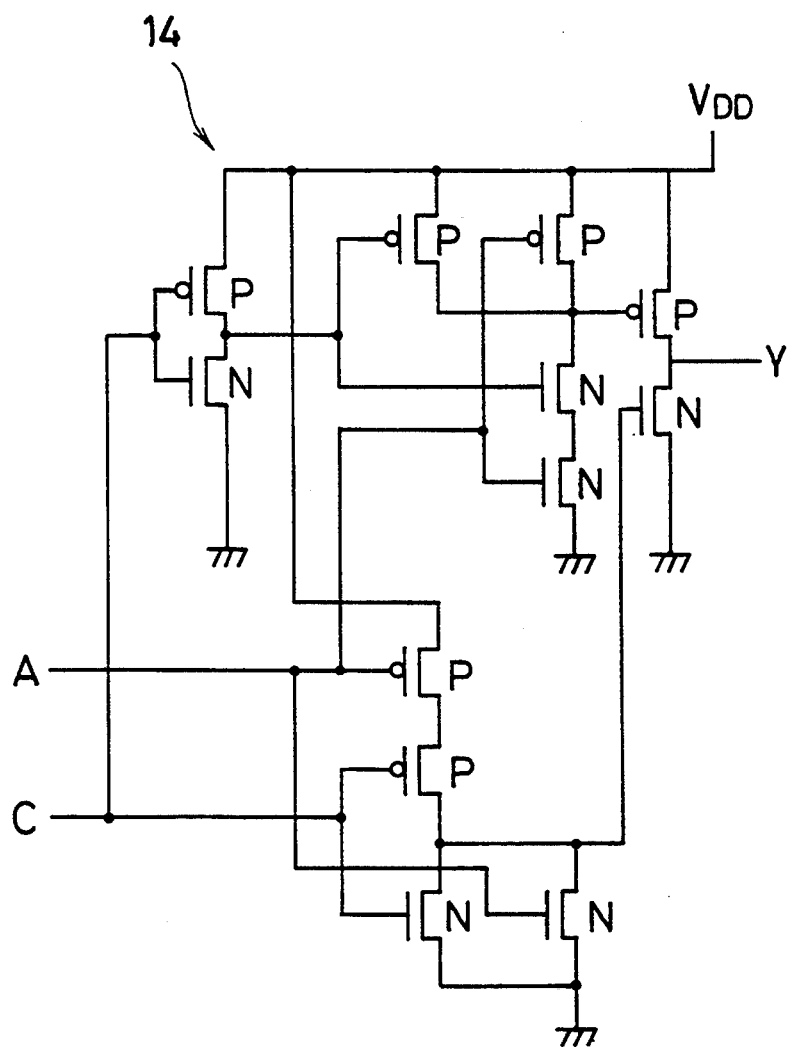
FIG. 3 is a circuit diagram showing a case where the tri-state gate is composed of a CMOS.

The 3-state gate 14 is a gate assuming, in addition to outputs H, L of an ordinary gate, a state known as a high impedance (shown by Z) which is neither H nor L. The high impedance state is equivalent to a state where the output is disconnected. The 3-state gate 14 depicted in FIG. 2(a) is expressed by a MIL symbol based description in FIG. 2(b). Referring to FIG. 2(b), the symbol A designates an output of the combinational logical unit 12, C represents a control signal, and Y indicates an output of the 3-state gate 14. The 3-state gate 14 includes: a NOR gate 32 for taking NOR of signals A and C; an inverter 33 for inverting the signal C; a NAND gate 34 for taking NAND of the signal A and the output of the inverter 33; a P-channel MOS transistor (hereinafter abbreviated to PchMOS or PMOS) 35 in which two (drain) electrodes are connected in series; and an N-channel MOS transistor (hereinafter abbreviated to NchMOS or NMOS) 36. The output of the NAND gate 34 is connected to the gate electrode of the PMOS 35, and one electrode (source electrode) thereof is connected to a power supply $V_{DD}$. On the other hand, the output of the NOR gate 32 is connected to the gate electrode of the NMOS 36, while the other electrode (source electrode) thereof is earthed. The output Y is taken out of a connecting portion between the PMOS 35 and the NMOS 36. The 3-state gate 14 is thus constructed. Further, FIG. 3 illustrates one example of the circuitry of the 3-state gate depicted in FIG. 2 configured by a CMOS. The PMOS 35 and the NMOS 36 on the output side are simultaneously turned OFF to create a high impedance state in the thus constructed 3-state gate.

The 3-state gate described above operates as shown in the following operation table. As shown in the operation table, when the control signal C is "0" (i.e., L with positive logic), the function is the same with an ordinary buffer. On the other hand, when the control signal is "1" (viz., H with positive logic), the output Y assumes the high impedance Z.

|   |         |
|---|---------|
| C | L L H H |
| A | H L H L |
| Y | H L Z Z |

The following is an explanation of an example where a logical block group for attaining a multiplexer function is constructed by use of a plurality of the thus configured logical blocks 10.

Figure 4:
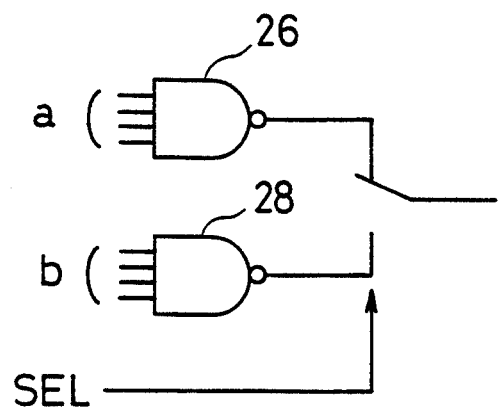
FIG. 4 is a circuit diagram showing an example where a eight-input multiplexer is constructed based on a logical structure according to the present invention.
Figure 5:
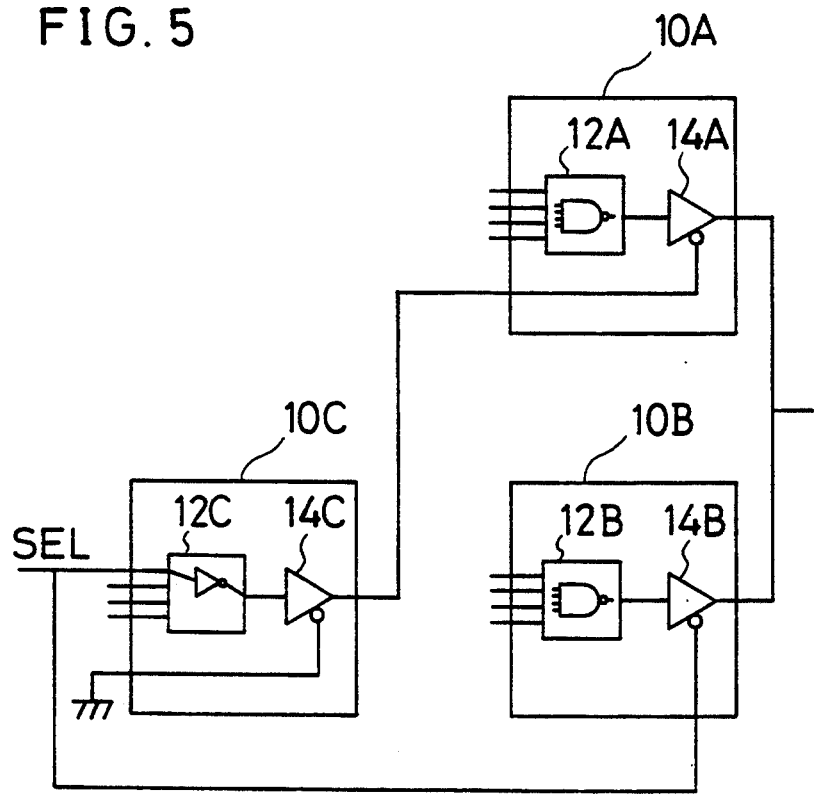
FIG. 5 is a circuit diagram showing an example where the eight-input multiplexer is constructed by use of the logical block illustrated in FIG. 1.

An eight-input multiplexer is, when the 3-state gate is constructed by using the logical blocks including the 3-state gates at the output terminals thereof, is demonstrated by simple circuitry illustrated in FIG. 4. In this Figure, the construction is based on four-input NAND elements 26, 28 and a switching element for switching the outputs from the NAND elements in accordance with a signal from a selector SEL. FIG. 5 shows a case where the eight-input multiplexer is configured by use of the logical blocks according to the present invention. This Figure depicts circuitry for constituting the 8-input multiplexer when being programmed so that one logical block incorporates, e.g., four-input NAND function. In this Figure, the 8 inputs are separated into two blocks, i.e., a four-input logical blocks 10A and a four-input logical block 10B. Still another logical block 10C is further prepared for constituting the selector SEL for supplying the control signals C to the 3-state gates serving as switch elements of the logical blocks 10A, 10B. FIG. 5 illustrates a result which the eight-input multiplexer is divided a group of these logical blocks and a situation where these logical blocks 10A–10C are wired by a group of programmable wires.

The logical blocks 10A and 10B include combinational logical units 12A and 12B, respectively. These combinational logical units 12A and 12B respectively attain the 4-input NAND functions and are connected to 3-state gates 14A and 14B connected at the rear stage. A control input terminal of the 3-state gate 14A is connected to an output terminal of the logical block 10C to which the select signal SEL is inputted from external elements. Besides, a control input terminal of the 3-state gate 14B is connected to an input terminal of the logical block 10C. The logical block 10C consists of a combinational logical block 12C incorporating an inverter function and a 3-state gate 14C, having its control input terminal to which signal L is inputted, for attaining a buffer function. The logical block 10C as a whole perform a function to generate a inverted signal of the selector signal SEL.

The embodiment in the first aspect of the present invention has been described so far. This embodiment has dealt with the case where the 8-input multiplexer is constructed of the three 4-input logical blocks. The present invention is not, however, limited to this construction. Other multiplexers such as, e.g., a 16-input multiplexer, a 32-input multiplexer or a multi-input multiplexer can be, as a matter of course, constructed by similarly employing the logical blocks. Besides, the respective logical blocks are connected by the programmable wires and are connectable to a variety of logical blocks. The interconnections are not necessarily limited to the adjacent logical blocks. Further, the respective logical blocks are directly connected through selectors each consisting of one logical block. Hence, there are exhibited such effects that the numbers of the used logical blocks and gate elements can be made smaller than in the prior art circuitry, and the gate using efficiency can be more improved than in the conventional circuitry.

Figure 20:
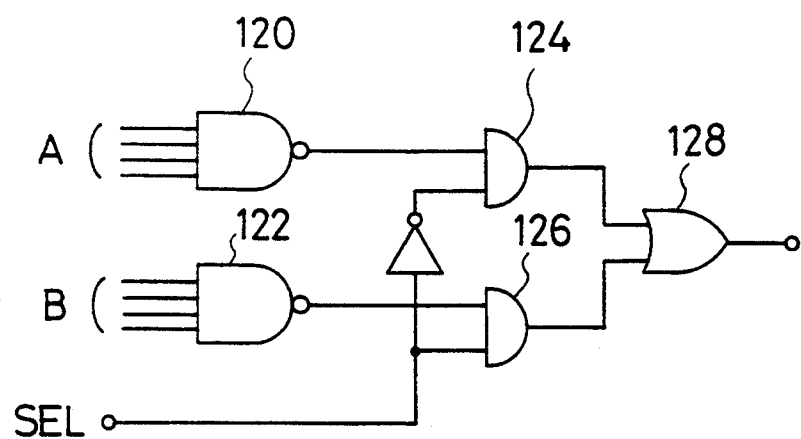
FIG. 20 is a circuit diagram showing an example where the eight-input multiplexer is constructed by use of the conventional logical blocks depicted in FIG. 18.

FIG. 20 demonstrates a constructive example where the conventional logical blocks illustrated in FIG. 18 are employed for attaining the 8-input multiplexer depicted in, for instance, FIGS. 4 and 5. A logical block 110 of FIG. 18 is composed of a 4-input/1-output combinational logical circuit 112 and an output buffer 114 connected to an output terminal of the combinational logical circuit 112. The output buffer 114 shown in FIG. 19(a) is constructed by, as illustrated in FIG. 19(b), cascade-connecting two inverters 116 and 118. A circuit for attaining the 8-input multiplexer by using the above-mentioned conventional logical blocks 110 consists of: 4-input NANDs 120 and 122; two pieces of 2-input ANDs 124 and 126 for taking logical products of outputs from the two NANDs 120 and 122 and outputs from other unillustrated circuit; and an OR 128 for taking a logical sum of outputs from the ANDs 124 and 126. Four pieces of logical blocks are used for constituting the above-described multiplexer. Therefore, in the conventional example shown in FIG. 20, four pieces of logical blocks are employed in contrast with the arrangement that the multiplexer is constructed of the tree logical blocks in the present invention, and the number of the logical blocks employed is greater by 1 than the former.

An embodiment in a second aspect of the present invention will be described by giving an example where a circuit for taking a logical sum A+B of the signals A and B is obtained by a wired-connection.

Figure 6:
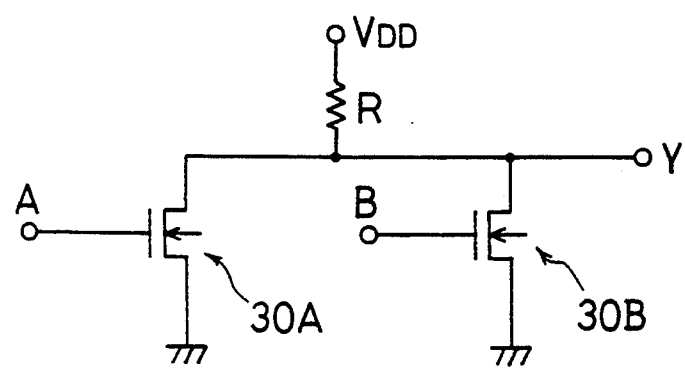
FIG. 6 is a circuit diagram showing an example where an OR circuit is constructed based on wired-logic.

To begin with, FIG. 6 illustrates simple circuitry for taking the logical sum of the two input signals A and B by the wired-connection. Referring to this Figure, the configuration is such that one source/drain electrodes of NMOS transistors 30A and 30B are connected in common, while the other source/drain electrodes thereof are earthed; a supply voltage $V_{DD}$ is connected via a resistor element R to a common wire to which the foregoing one source/drain electrodes are connected in common; and an output terminal Y is provided at the other end of the common wire.

Figure 7:
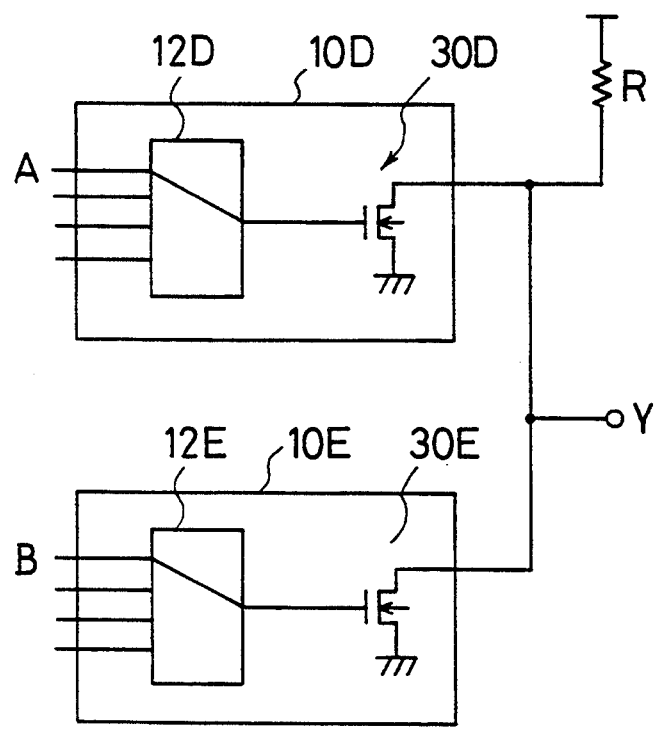
FIG. 7 is a circuit diagram showing an example where a multi-input OR circuit is constructed by use of the logical blocks employed for the semiconductor integrated circuit in a second aspect of the present invention.

FIG. 7 shows a case where the circuit of FIG. 6 is constructed of two pieces of logical blocks 10D and 10E. The logical blocks 10D and 10E are respectively composed of 4-input combinational logical units 12D and 12E and NMOS transistors 30D and 30E. One outputs of the NMOS transistors 30D and 30E are connected in common by a programmably connectable wire element. This common connecting wire is connected via the resistor element R to the supply voltage $V_{DD}$ and also to an output Y.

In the thus constructed logical block group, the signal A is supplied to one terminal of the logical block 10D, while the signal B is supplied to one terminal of the logical block 10E. Then, the signals A and B are outputted respectively from the combinational circuits 12D and 12E and supplied to gate terminals of the NMOS transistors 30D and 30E. The NMOS transistors 30D and 30E are thereby turned ON or OFF. A logical sum of the signals A and B is, after being wired-ORed in the wired-connected common connecting wire corresponding to the ON/OFF states of the NMOS transistors 30D and 30E, outputted from the output terminal Y.

There has been explained so far the example of taking the logical sum of the two signals with respect to the wired connection in the second aspect. However, this is, as a matter of course, applicable to a case of a multi-input logical sum. In addition, the same logical function with the embodiment in the first aspect is attainable.

Further, the logical blocks including the 3-state gates shown in FIG. 1 and the wired-connected NMOS transistors are changed over by selectors or the like according to the applications thereof, whereby one logical block placement is also possible.

Next, a semiconductor integrated circuit in a third aspect of the present invention will be described with reference to FIGS. 8 through 15.

Figure 8:
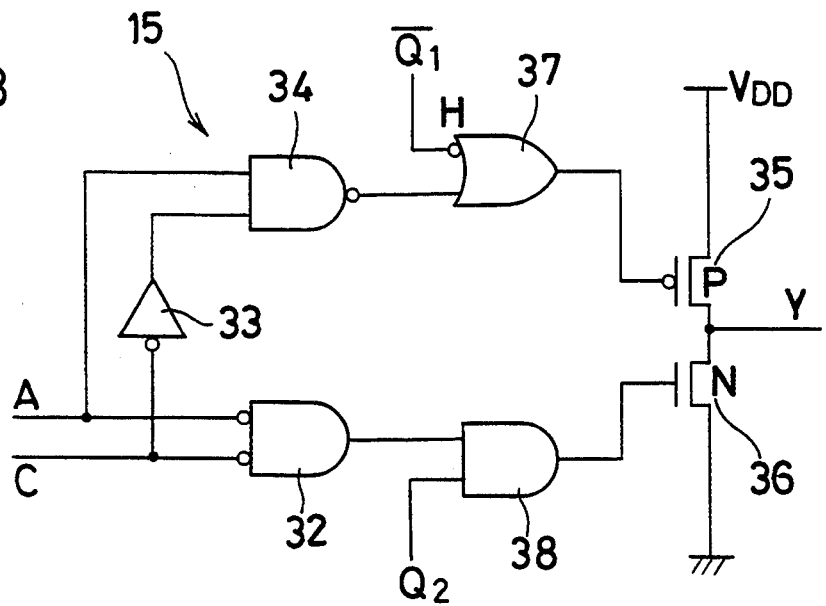
FIG. 8 is a circuit diagram showing one embodiment of a gate element used for the semiconductor integrated circuit in a third aspect of the present invention.

FIG. 8 is a circuit diagram of circuitry described by the MIL symbols in one embodiment of a gate element used for the output buffer unit of the logical block according to the present invention, illustrating a gate element 15 employed in place of the 3-state gate 14 in the logical block 10 of FIG. 1. Excepting an OR gate 37 and an AND gate 38, the gate element 15 depicted in FIG. 8 has the same construction as that of the 3-state gate 14 illustrated in FIG. 2. The same components are marked with the like numerals, and the description thereof is omitted.

In the gate element 15, as depicted in FIG. 8, an output of a NAND gate 34 is connected to one input of the OR gate 37. Negative logic ($\overline{Q_1}$: inverted value of $Q_1$) of a signal $Q_1$ for defining a circuit function is inputted to the other input of the OR gate 37. An output of this OR gate is connected to a gate electrode of the PMOS 35. On the other hand, an output of a NOR gate 32 is connected to one input of the AND gate 38, while a circuit function defining signal $Q_2$ is inputted to the other input of the AND gate 38. An output of this AND gate 38 is connected to a gate electrode of an NMOS 36.

Note that the circuit function defining signals $Q_1$, $Q_2$ are signals given from an unillustrated memory device for defining the circuit function of the semiconductor integrated circuit of this invention. The memory device for defining the circuit function may involve the use of an EPROM, an SRAM and an EEPROM attained by known techniques.

Now, the operation of the gate element illustrated in FIG. 8 will be explained.

Figure 9:
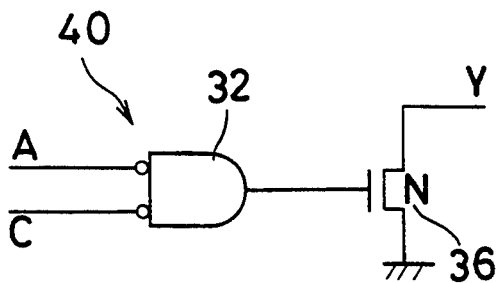
FIG. 9 is an equivalent circuit diagram showing one mode of using the gate element illustrated in FIG. 8.
Figure 10:
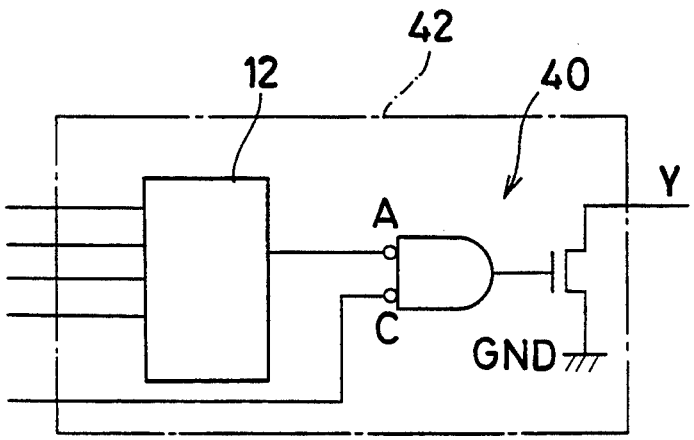
FIG. 10 is a circuit diagram illustrating a logical block configured by using the equivalent circuit of the gate element depicted in FIG. 9.
Figure 11:
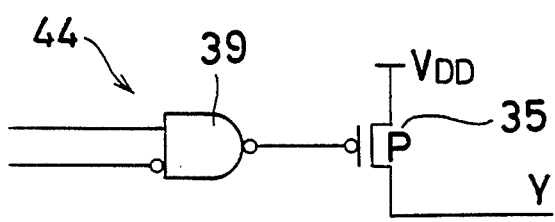
FIG. 11 is an equivalent circuit diagram showing another using mode of the gate element depicted in FIG. 8.

To begin with, the signal $\overline{Q_1}$ assumes "L", while the signal $Q_2$ assumes "H". At this moment, the output of the OR gate 37 becomes "H", therefore the PMOS 35 is turned OFF. Because of the signal $Q_2$ being "H", the AND gate 38 directly outputs the output of the NOR gate 32 and then inputs it to the gate electrode of the NMOS 36. Namely, the output Y of the gate element 15 assumes a state of an open drain output of the NMOS 36. Hence, when $\overline{Q_1}$="L" and $Q_2$="H", the gate element 15 exhibits a circuit function equivalent to a gate element 40 of the open drain output which is shown in FIG. 9. Therefore, it follows that the logical block 10 including the gate element 15 as an output buffer incorporates the circuit function equivalent to a programmable logical element (logical block) 42 illustrated in FIG. 10. It is therefore possible to easily construct a wired OR circuit shown in FIG. 6 or 7 by wired-connecting the output terminals of the logical blocks 42 illustrated in FIG. 10.

Next, the signal $Q_2$ assumes "L", while the signal $\overline{Q_1}$ assumes "H". At this time, since the signal $Q_2$ is "L", the output of the AND gate 38 is also "L". Consequently, the NMOS 36 is turned OFF, while the signal $\overline{Q_1}$ assumes "H". For this reason, the OR gate 37 directly inputs the output of the NAND gate 34 to the gate electrode of the PMOS 35. Therefore, the output Y of the gate element 15 assumes a state of the open drain output of the PMOS 35. Hence, the gate element 15 at this moment exhibits a circuit function equivalent to a gate element 44 which is in the open drain output state shown in FIG. 11. A logical circuit element 39 is an element incorporating a logical function combined with the inverter 33 and the NAND gate 34. For this reason, this implies that the logical block 10 having the gate element 15 as an output buffer exhibits a circuit function equivalent to a logical block (PLE) shown in FIG. 12.

Figure 12:
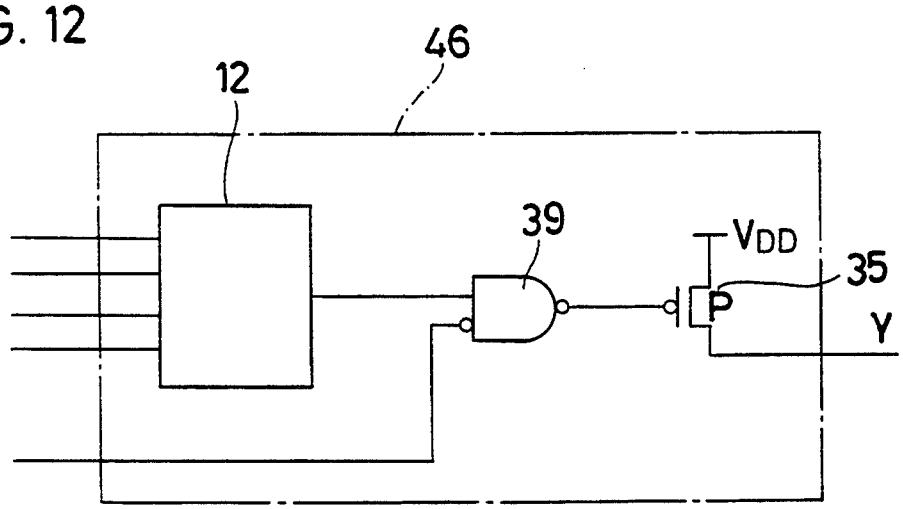
FIG. 12 is a circuit diagram illustrating a logical block configured by using the equivalent circuit of the gate element depicted in FIG. 11.
Figure 13:
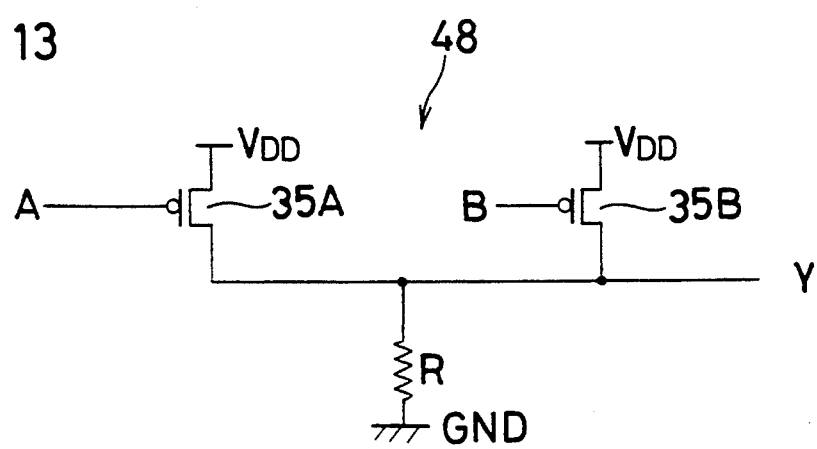
FIG. 13 is a circuit diagram showing one embodiment of a multi-input OR circuit constructed by using the logical blocks depicted in FIG. 12.

Consequently, the logical circuit block 46 illustrated in FIG. 12 is employed, and the output terminal thereof is wired-connected. Thus, it is possible to construct a wired OR circuit 48 in which a logical sum (OR) of the signals A and B shown in FIG. 13 is attained by the wired connection. The following is a construction of the wired OR circuit 48 depicted in FIG. 13. One source/drain electrodes of two PMOSs 35A and 35B are connected in common, and this common connecting wire is earthed through the resistor element R. The other source/drain electrodes of the PMOSs 35A and 35B are connected respectively to the supply voltage $V_{DD}$. Further, the output terminal Y is provided at one end of the common connecting wire. The signals A and B are inputted individually to the gate electrodes of the PMOSs 35A and 35B.

The above-mentioned wired OR circuit 48 can be constructed of logical circuit blocks 46D and 46E illustrated in FIG. 14. The logic blocks 46D and 46E can be obtained by means of inputting the signal "0" to the input terminal of the logic block as shown in FIG. 12. The wired OR circuit shown in FIG. 14 is herein composed of the logical blocks 46D and 46E composed of 4-input/1-output combinational logical circuits 12D and 12E and PMOSs 35D and 35E the outputs of which are connected to the gate electrodes. The outputs of these two blocks 46D and 46E are wired-connected and earthed through the resistor element R. On the other hand, the other electrodes of the PMOSs 35D and 35E are connected respectively to the supply voltage $V_{DD}$. The signals A and B are inputted to one input terminals of the two blocks 46D and 46E and further to the combinational circuits 12D and 12E. The signals are then outputted therefrom and supplied to the gate electrodes of the PMOSs 35D and 35E. The PMOSs 35D and 35E are turned ON or OFF depending on the signal states. Outputted to the wired-connected output terminal Y is a wired OR of the signals A and B, i.e., a logical sum thereof.

As discussed above, when the gate element 15 assumes the second state of the open drain output, the logical block 10 is wired-connectable, and the logical sum can be outputted.

Next, when the signal $\overline{Q_1}$ is "H" and the signal $Q_2$ is "H", the OR gate 37 directly inputs the output of the NAND gate 34 to the gate of the PMOS 35 because of the signal $\overline{Q_1}$ being "H". The AND gate 38 directly input the output of the NOR gate 32 to the gate of the NMOS 36. Namely, the output Y of the gate element 15 assumes a state of a totem-pole output between the PMOS 35 and the NMOS 36. Therefore, it follows that the gate elements 15 illustrated in FIG. 8 has the circuitry equivalent to the 3-state gate (buffer) 14 shown in FIG. 2(b) and performs absolutely the same operation. Hence, the description thereof is omitted.

Note that when both of the signals $\overline{Q_1}$ and $Q_2$ assume "L", the output of the OR gate 37 becomes "H" because of the signal $\overline{Q_1}$ being "L". The PMOS 35 is turned OFF, and, since the output of the AND gate 38 is "L", the NMOS 36 is turned OFF. The gate element 15 therefore outputs nothing to make the output of the logical block 10 unable.

As discussed above, the gate element 15 makes it possible to make unable the output from the logical block in the first state of the totem-pole output. On the other hand, the logical sum output can be executed by making possible the wired connection of the logical block in the second state of the open drain output.

Figure 15:
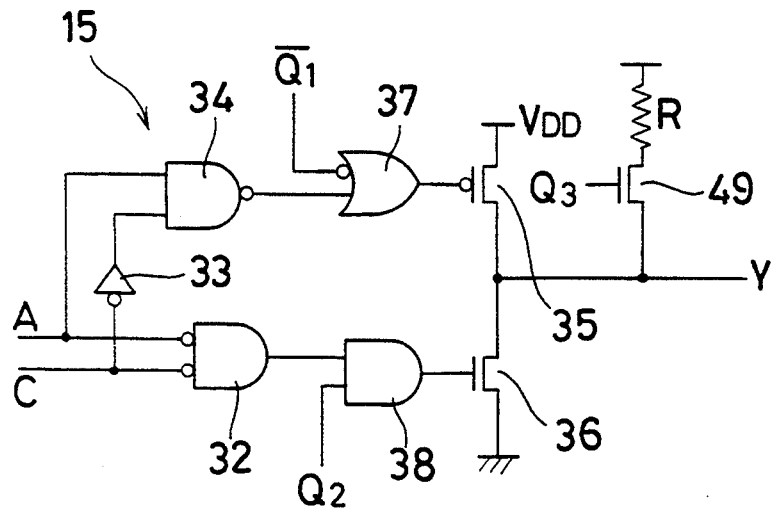
FIG. 15 is a circuit diagram showing another embodiment of the gate element used for the semiconductor integrated circuit of the present invention.

The resistor element for the construction of a wired logic circuit is disposed within the logic block, and a NMOS 49 which can be controlled by a signal $Q_3$ is disposed between the output terminal Y of the gate element 15 and a power source voltage $V_{DD}$ as shown in FIG. 15 so that the NMOS 49 is connected to the power voltage $V_{DD}$ via a resistor R in order to programmably interconnect the output terminal Y and one of the power source terminals. Incidentally, the signal $Q_3$ is a circuit function defining signal as in the case of the signals $Q_1$ and $Q_2$ and is given from the memory device for defining the above-mentioned circuit function. The NMOS 49 is turned on and off according to the state of the signal $Q_3$ to achieve a resistor element for the formation of the wired logic.

Figure 16:
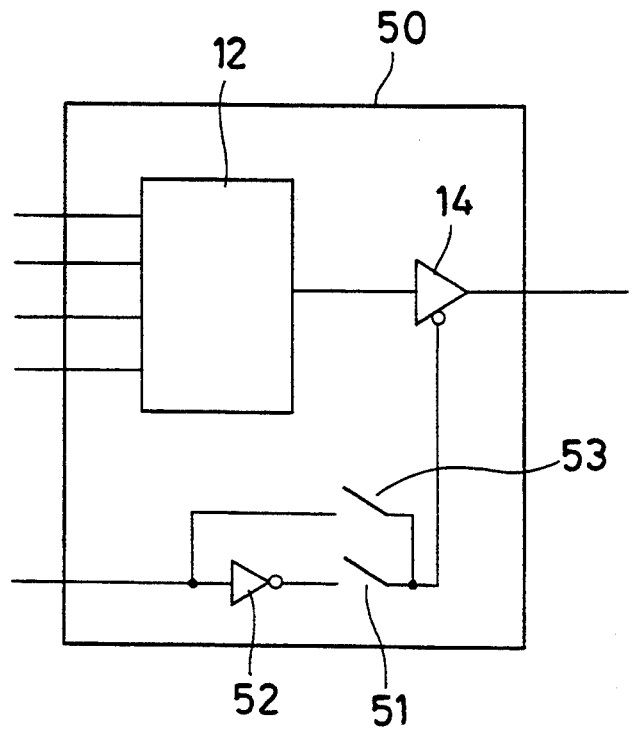
FIG. 16 is a block diagram showing the other embodiment of the logical block used for the semiconductor intergrated circuit of the present invention.

As shown in FIG. 16, an inverter 52 is connected to the control terminal of the tri-state gate 14 of the logic block 50 via a programmable switch 51, and a programmable switch 53 is also connected to the tri-state gate 14 in parallel with the programmable switch 51 in such a way that the switch 53 bypasses the programmable switch 51 and the inverter 52 so that the logic of the control terminal can be programmably inverted. The gate element having the control terminal whose logic can be inverted is not limited to the tri-state gate 15, and may be a gate element such as shown in FIG. 7, FIG. 8 and FIG. 15, and a programmable gate element.

Figure 17:
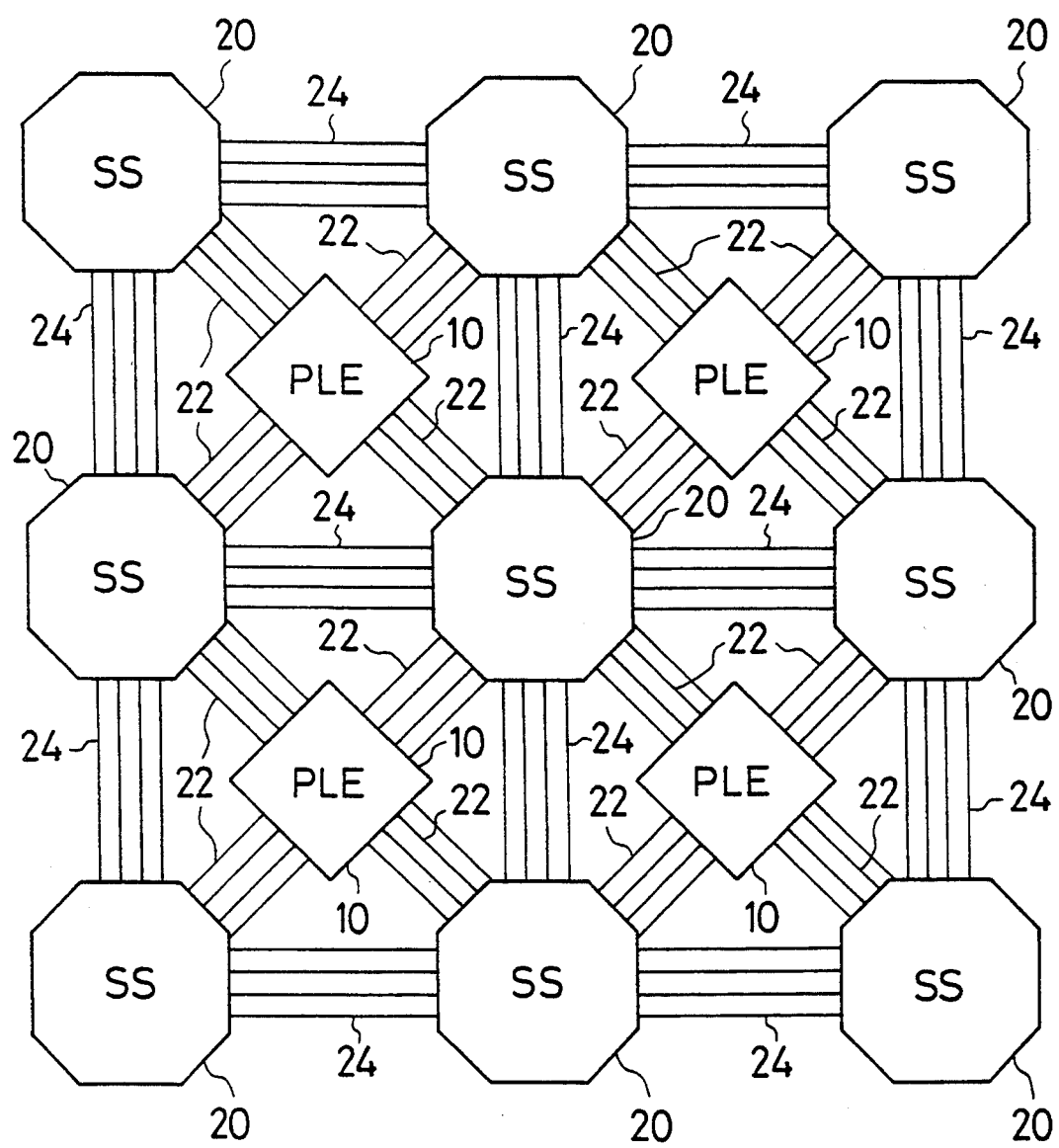
FIG. 17 is a schematic diagram illustrating a programmable logic device including the small-sized logical blocks.

As depicted in FIG. 17, the logical blocks in which a variety of gate elements are employed as output buffers are usable in the form of the programmable logic elements 10 for the programmable logic device (PLD) defined as the semiconductor integrated circuit of the present invention. It is to be noted that the embodiments given above have dealt with the example where each circuit consists of the CMOS but may be of course constructed of a TTL. Besides, when being composed of a CMOS, either the NMOS or the PMOS may be employed.

The present invention is not limited to the embodiments discussed above but may be modified and changed in many ways. For instance, the logical block shown in FIG. 1 may incorporate an added element such as a flip-flop properly wired to constitute other functions, e.g., a counter, a shift register, etc. by programming. The logical block can be provided with a variety of functions corresponding to the applications.

According to the present invention, the small-sized blocks are directly connected to each other to form one logical block group. The output control of the logical block group is executed in concentration by one or more logical blocks, thereby configuring a desired logical circuit. Hence, the desired logic is structured more easily than by the conventional logical blocks. The number of logical blocks, viz., the gates employed can be reduced. A gate integration density can be improved as a whole semiconductor integrated circuit.

What is claimed is:

1. A semiconductor integrated circuit having electrically writable functions, comprising:
    a plurality of logical blocks having electrically writable functions; and
    wire elements capable of programmably connecting said logical blocks to each other,
    wherein each of said logical blocks includes a gate element having a control terminal connectable to output terminals of a plurality of other logical blocks, and said gate element is brought into a high impedance state when a signal assuming a predetermined level is inputted to said control terminal of said gate element to disable output of said logical block.

2. The semiconductor integrated circuit according to claim 1, wherein said gate element is a tri-state output gate element.

3. The semiconductor integrated circuit according to claim 1, wherein a logic of said control terminal of the gate element can be inverted.

4. A semiconductor integrated circuit having electrically writable functions, comprising:
    a plurality of logical blocks having electrically writable functions; and
    wire elements capable of programmably connecting said logical blocks to each other,
    wherein each of said logical blocks includes a programmable gate element having a control terminal, an output of said programmable gate element of said logical block is connectable to one of the control terminal and the output of an other of said programmable gate elements, and said programmable gate element assumes a first state of a totempole output and a second state of an open drain output.

5. The semiconductor integrated circuit according to claim 4, wherein an output terminal of said logical block is programmably connectable to one of power source terminals via a resistor element.

6. The semiconductor integrated circuit according to claim 4, wherein a logic of said control terminal of the programmable gate element can be inverted.

* * * * *